United States Patent
Khan

(10) Patent No.: US 12,256,587 B2
(45) Date of Patent: Mar. 18, 2025

(54) METHOD FOR PRODUCING A PEROVSKITE SOLAR CELL

(71) Applicant: KING FAHD UNIVERSITY OF PETROLEUM AND MINERALS, Dhahran (SA)

(72) Inventor: Firoz Khan, Dhahran (SA)

(73) Assignee: KING FAHD UNIVERSITY OF PETROLEUM AND MINERALS, Dhahran (SA)

( * ) Notice: Subject to any disclaimer, the term of this patent is extended or adjusted under 35 U.S.C. 154(b) by 42 days.

(21) Appl. No.: 18/399,094

(22) Filed: Dec. 28, 2023

(65) Prior Publication Data
US 2024/0138161 A1   Apr. 25, 2024

Related U.S. Application Data

(62) Division of application No. 17/889,832, filed on Aug. 17, 2022, now Pat. No. 11,903,224.

(51) Int. Cl.
*H10K 30/10* (2023.01)
*H10K 71/12* (2023.01)
(Continued)

(52) U.S. Cl.
CPC .............. *H10K 30/10* (2023.02); *H10K 71/12* (2023.02); *H10K 71/40* (2023.02); *H10K 85/211* (2023.02);
(Continued)

(58) Field of Classification Search
CPC ........ H10K 30/10; H10K 71/12; H10K 71/40; H10K 85/211; H10K 2102/00; H10K 30/20; H10K 85/20; H10K 85/215; H10K 85/50; B82Y 30/00; C01B 32/182; G02F 1/01791; H01F 1/42; H01L 29/66015; H01L 31/035218; Y10S 438/962; Y10S 502/525; Y10S 977/734
See application file for complete search history.

(56) References Cited

U.S. PATENT DOCUMENTS 10,483,104 B2    11/2019  Naito et al.
2010/0316331 A1*  12/2010  Kenney ............... C09K 11/665
                                                313/503
(Continued)

FOREIGN PATENT DOCUMENTS

CN       109802043 A    5/2019
CN       112210816 A    1/2021

OTHER PUBLICATIONS

Yan Liu "Cu-doped nickel oxide hole transporting layer via efficient low-temperature spraying combustion method for perovskite solar cells" Journal of Materials Science: Materials in Electronics (2019) 30:15627-15635 (Year: 2019).*

(Continued)

*Primary Examiner* — Michael Y Sun
(74) *Attorney, Agent, or Firm* — Oblon, McClelland, Maier & Neustadt, L.L.P.

(57) ABSTRACT

The perovskite solar cell (PSC) includes a first layer containing a conducting material coated glass plate as a substrate, a second layer containing copper doped nickel oxide, a third layer containing a perovskite, a fourth layer containing nitrogen (N)-doped graphene quantum dots, a fifth layer containing phenyl-C61-butyric acid methyl ester and a top layer including conductive layer. A method for producing the perovskite solar cell is also discussed.

18 Claims, 8 Drawing Sheets

(51) Int. Cl.
  H10K 71/40      (2023.01)
  H10K 85/20      (2023.01)
  B82Y 30/00          (2011.01)
  C01B 32/182         (2017.01)
  G02F 1/017          (2006.01)
  H01F 1/42           (2006.01)
  H01L 29/66          (2006.01)
  H01L 31/0352        (2006.01)
  H10K 102/00         (2023.01)

(52) U.S. Cl.
  CPC .............. B82Y 30/00 (2013.01); C01B 32/182 (2017.08); G02F 1/01791 (2021.01); H01F 1/42 (2013.01); H01L 29/66015 (2013.01); H01L 31/035218 (2013.01); H10K 2102/00 (2023.02); Y10S 438/962 (2013.01); Y10S 502/525 (2013.01); Y10S 977/734 (2013.01)

(56) References Cited

U.S. PATENT DOCUMENTS

2019/0229285 A1  7/2019  Kuang et al.
2020/0091359 A1  3/2020  Hosokawa
2021/0143351 A1  5/2021  Huang et al.

OTHER PUBLICATIONS

M. G. Helander "Work function of fluorine doped tin oxide" J. Vac. Sci. Technol. A 29, 011019 (2011) (Year: 2011).*

Hui Chen "Boosting Multiple Interfaces by Co-Doped Graphene Quantum Dots for High Efficiency and Durability Perovskite Solar Cells" ACS Appl. Mater. Interfaces 2020, 12, 13941-13949 (Year: 2020).*

Zhurong Liang "A large grain size perovskite thin film with a dense structure for planar heterojunction solar cells via spray deposition under ambient conditions" RSC Adv., 2015, 5, 60562 (Year: 2015).*

Qiang Guo, et al., "Passivation of the grain boundaries of $CH_3NH_3PbI_3$ using carbon quantum dots for highly efficient perovskite solar cells with excellent environmental stability", Nanoscale, vol. 11, Issue 1, Nov. 20, 2018, pp. 115-124.

Xinlei Gan, et al., "Graphite-N Doped Graphene Quantum Dots as Semiconductor Additive in Perovskite Solar Cells", ACS Applied Materials & Interfaces, vol. 11, Issue 41, Sep. 24, 2019, pp. 37796-37803 (Abstract only).

Zhengrui Yang, et al., "Efficient and highly light stable planar perovskite solar cells with graphene quantum dots doped PCBM electron transport layer", Nano Energy, vol. 40, Oct. 2017, pp. 345-351 (Abstract only).

* cited by examiner

METHOD FOR PRODUCING A PEROVSKITE SOLAR CELL

CROSS-REFERENCE TO RELATED APPLICATIONS

The present application is a Divisional of U.S. application Ser. No. 17/889,832, now allowed, having a filing date of Aug. 17, 2022.

BACKGROUND

Technical Field

The present disclosure is directed to solar cells, particularly to the passivation of perovskite solar cells (PSC) and a method of preparation thereof.

Description of Related Art

The "background" description provided herein is to generally present the context of the disclosure. Work of the presently named inventors, to the extent it is described in this background section, as well as aspects of the description that may not otherwise qualify as prior art at the time of filing, are neither expressly nor impliedly admitted as prior art against the present invention.

Metal halide perovskites (MHPs) are an unconventional family of crystalline materials with continuously expanding compositional and structural spaces. MHPs intrinsically possess soft crystal lattices that contribute to unusual internal carrier dynamics and lead to their facile interaction with the external environment (matter, light, temperature, electric field, etc.). In the past decade metal halide perovskites (PVSK) solar cells (PSCs) have emerged as mounting leading photovoltaic (PV) technology. PSCs have achieved a power conversion efficiency (PCE; η) of more than 25.5%, which is higher than the commercially available thin-film PV technologies and competes with c-Si solar cells. Despite excellent PCE, several issues including electrical instability, nonradiative recombination, long-term operational stability, and anomalous current density-voltage (J-V) hysteresis, hinder the industrial commercialization of PSCs. The primary reason for these limitations relates to a high density of defects ($10^{15}$-$10^{20}$ cm$^{-3}$) in the PVSK layer due to very low defect formation energy (<0.5 eV) and low activation energy for ionic migration. Furthermore, the existence of defect sites at the PVSK surface and grain boundaries caused deterioration of the cell performance because these sites allowed infiltration of ambient oxygen and moisture into the PVSK layer. Hence, the passivation of the perovskites layer is vital to obtaining stable PSCs against temperature and humidity.

The passivation of perovskites with an amphiphilic interlayer of nitrogen functionalized GQDs (NGQDs) improved the perovskites/CTL interface and also controlled the passivation layer thickness due to its small size which was challenging in organic cations having long-chain. The nitrogen-doped graphene quantum dots (NGQDs) interlayer at the metal halide perovskites (PVSK)/electron transport layer (ETL) interface suppresses the defect-assisted recombination in the PSCs. Besides, the NGQDs promote charge transportation in the PVSK layer as well as at PVSK/ETL interface. Thus, the PVSK passivation with NGQDs consequences in the upsurge of the recombination lifetime which are confirmed through photoluminescence (PL), electrochemical impedance spectroscopy (EIS), and space charge limited (SCL) measurement, respectively. Also, lone pair electrons in nitrogen could interact with cations and passivate the positive charge defects. Combining all these properties made GQDs a potential material for retarding electron recombination in PSCs. Previously graphene oxide (GO) and N-doped graphene had been in-situ incorporated in the precursor solution, thus, an improvement in the device performance was obtained. Moreover, multilayer graphene had also been used at PVSK/ZnO interface to protect the device from degradation.

In view of the forgoing, one objective of the present disclosure is to provide a perovskite solar cell passivated with graphene quantum dots and a method for making thereof.

SUMMARY

In an exemplary embodiment, a perovskite solar cell (PSC) is described. The perovskite solar cell (PSC) includes a first layer containing a conducting material coated glass plate as a substrate, a second layer containing copper doped nickel oxide, a third layer containing a perovskite, a fourth layer containing nitrogen (N)-doped graphene quantum dots, a fifth layer containing a fulleren derivative and a top layer including a conductive layer.

In some embodiments, the PSC has an interfacial charge transfer resistance of $1\times10^5$ to $9\times10^5$ ohms (Ω).

In some embodiments, the PSC has the nanoparticles with a conversion efficiency of 16 to 20%.

In some embodiments, the PSC has metal halide perovskite in the form of crystalline flakes with a mean diameter of 0.1 to 1 micrometers (μm).

In some embodiments, the PSC has an integrated current density that is 5 to 10% greater than PSC without N-doped graphene quantum dots.

In some embodiments, the PSC has a recombination lifetime of 50 to 80 nanoseconds (ns).

In some embodiments, the PSC has an interfacial charge transfer of 3 to $10\times10^5$ Ω.

In some embodiments, the PSC has a suppresses trap density of 3 to $10\times10^{16}$ centimeters$^{-3}$ (cm$^{-3}$).

In some embodiments, the PSC has an ideality factor (n) of 0.8 to 1.5.

In some embodiments, the PSC has a leakage current ($J_0$) of 0.5 to $3\times10^{-16}$ amperes per centimeters square (A/cm$^2$).

In some embodiments, the PSC has the fourth layer that suppresses defect-assisted recombination.

In some embodiments, the PSC has a conductivity of 2 to $6\times10^{-8}$ siemens per centimeter (Scm$^{-1}$).

In some embodiments, the method of producing PSC includes treating the conducting material coated glass plate in UV ozone to produce the substrate as the first layer, coating the copper doped nickel oxide on the top of the substrate to produce the second layer, coating the perovskite on the second layer to produce the third layer, coating a solution of N-doped graphene quantum dots on the third layer to produce the fourth layer, coating the fullerene derivative on the fourth layer to produce the fifth layer and coating the conductive layer on the fifth layer to produce the top layer.

In some embodiments, the method includes the substrate being cleaned with at least one soap solution, water, alcohol, and acetone before the treatment in UV ozone.

In some embodiments, the method includes the solution of N-doped graphene quantum dots coated on the third layer by thermal annealing at 50-200° C. to produce the fourth layer.

In some embodiments, the method includes the conductive layer being coated by electron beam deposition on the fifth layer to produce the top layer.

In some embodiments, the method includes the top layer having a thickness of 100-300 nanometers (nm).

The foregoing general description of the illustrative present disclosure and the following detailed description thereof are merely exemplary aspects of the teachings of this disclosure and are not restrictive.

BRIEF DESCRIPTION OF THE DRAWINGS

A more complete appreciation of this disclosure and many of the attendant advantages thereof will be readily obtained as the same becomes better understood by reference to the following detailed description when considered in connection with the accompanying drawings, wherein.

DETAILED DESCRIPTION

Figure 1:
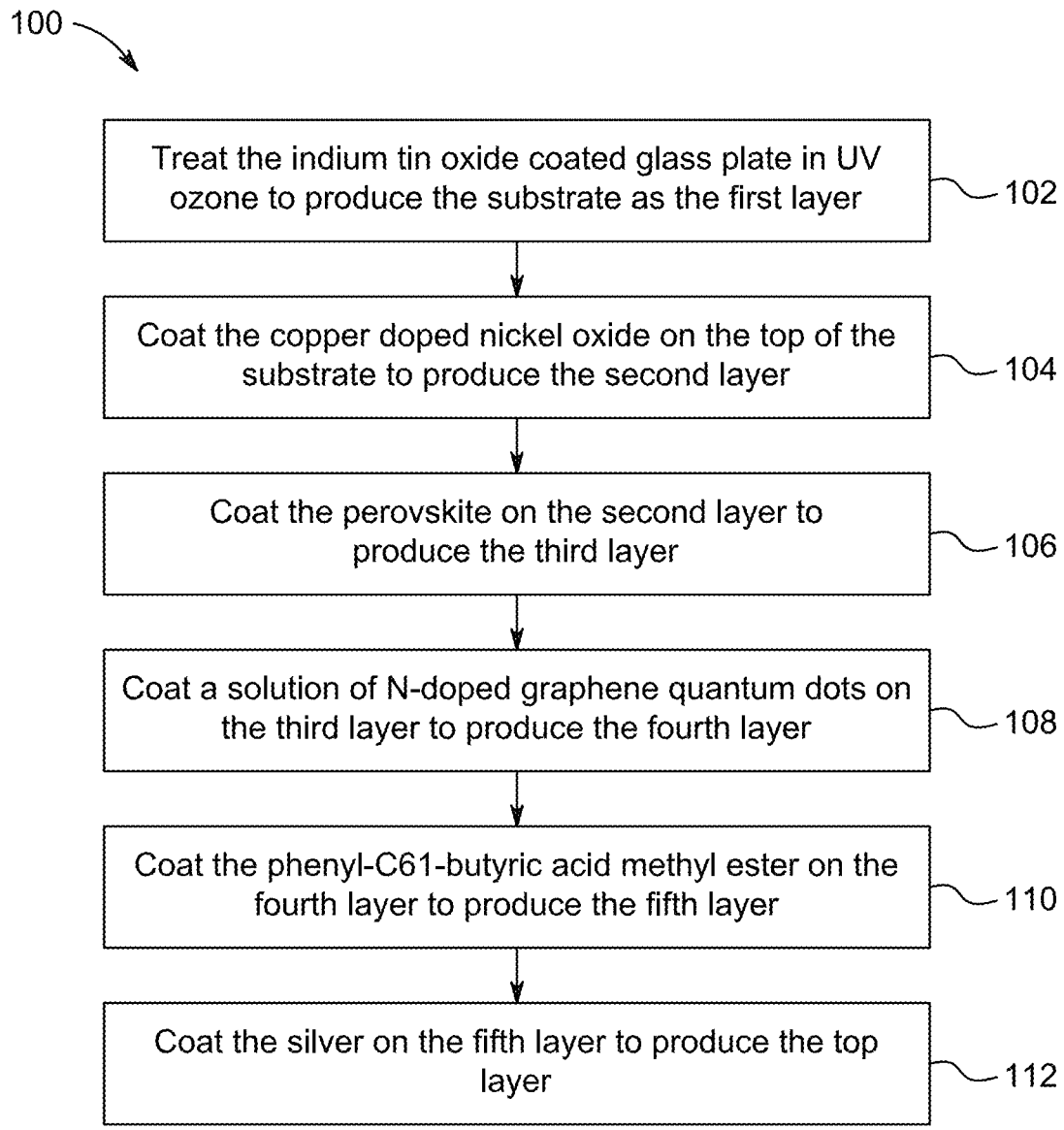
FIG. 1 is a schematic flow diagram of a method for producing a perovskite solar cell (PSC), according to certain embodiments.

The present disclosure will be better understood with reference to the following definitions.

It will be understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

In the drawings, like reference numerals designate identical or corresponding parts throughout the several views. Further, as used herein, the words "a," "an" and the like generally carry a meaning of "one or more," unless stated otherwise. Also, the use of "or" means "and/or" unless stated otherwise. Similarly, "comprise," "comprises," "comprising" "include," "includes," and "including" are interchangeable and not intended to be limiting.

Furthermore, the terms "approximately," "approximate," "about," and similar terms generally refer to ranges that include the identified value within a margin of 20%, 10%, or preferably 5%, and any values there between. For example, if a stated value is about 8.0, the value may vary in the range of 8±1.6, ±1.0, ±0.8, ±0.5, ±0.4, ±0.3, ±0.2, or ±0.1.

Disclosure of values and ranges of values for specific parameters (such as temperatures, molecular weights, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that parameter X may have a range of values from about A to about Z. Similarly, it is envisioned that disclosure of two or more ranges of values for a parameter (whether such ranges are nested, overlapping or distinct) subsume all possible combination of ranges for the value that might be claimed using endpoints of the disclosed ranges. For example, if parameter X is exemplified herein to have values in the range of 1-10 it also describes subranges for Parameter X including 1-9, 1-8, 1-7, 2-9, 2-8, 2-7, 3-9, 3-8, 3-7, 2-8, 3-7, 4-6, or 7-10, 8-10 or 9-10 as mere examples. A range encompasses its endpoints as well as values inside of an endpoint, for example, the range 0-5 includes 0, >0, 1, 2, 3, 4, <5 and 5.

As used herein, the words "preferred" and "preferably" refer to embodiments of the technology that afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the technology.

As used herein, the term "solar cell" refers to an electrical device that converts the energy of light directly into electricity by the photovoltaic effect, which is a physical and chemical phenomenon.

As used herein, the term "graphene" refers to an allotrope of carbon consisting of a single layer of atoms arranged in a two-dimensional honeycomb lattice nanostructure.

As used herein, the term "resistance" refers to a measure of the opposition to current flow in an electrical circuit.

According to a first aspect, the present disclosure relates to a perovskite solar cell (PSC) comprising a first layer comprising a conducting material coated glass plate as a substrate, a second layer comprising copper doped nickel oxide, a third layer comprising a perovskite, a fourth layer comprising N-doped graphene quantum dots, a fifth layer comprising a fullerene derivative, and a top layer comprising a conductive layer. The top layer is silver.

The substrate maybe a conducting material coated glass plate. The conducting material is selected from the group consisting of fluorine doped tin oxide, indium tin oxide, aluminum doped zinc oxide, gallium doped zinc oxide, indium zinc oxide, indium zinc tin oxide, indium aluminum zinc oxide, indium gallium zinc oxide, indium gallium tin oxide, and antimony tin oxide.

In an embodiment, the substrate is an indium tin oxide or fluorine doped tin oxide coated glass plate.

The surface of the glass plate is coated with the conductive material at least 70%, preferably at least 75%, more preferably at least 80%. The substrate may be of any desirable shape, such as, a circle, a triangle, a rectangle, a pentagon, a hexagon, an irregular polygon, a circle, an oval, an ellipse, or a multilobe. Preferably, the substrate is rectangular in shape with a length and width of 0.5-5 cm, 1-4 cm, or 2-3 cm, respectively. The substrate may have an area in a range of 0.25-25 $cm^2$, preferably 0.5-5 $cm^2$, more preferably about 2 $cm^2$.

In an embodiment, the substrate layer has a thickness of 100-1000 μm, preferably 200-900 μm, preferably 200-800 μm, preferably 200-700 μm, preferably 200-600 μm.

In an embodiment, the second layer has a thickness of 10-500 nm, preferably 10-400 nm, preferably 10-300 nm.

In an embodiment, the second layer may use a different metal in place of the copper, such as Zn, Cu, Co, Mn, Mg, Be, and Ti. In an embodiment, NiO maybe crystalline or amorphous and doped with 0.5-2 wt % of a doping agent to change an electronic property, for instance, by introducing electron holes or valence electrons. The doping agents may include silicon, phosphorous, boron, alkaline-earth metals (such as Ca, Ba, or Sr), alkali metals (such as Na, K, Li), gallium, germanium, arsenic, indium, antimony, bismuth, or lead.

A matrix material may be used to support the structure, and this matrix material may not significantly contribute or change the optical properties of the photoactive layer. The matrix material may be a polymer matrix of polymethylmethacrylate (PMMA), polystyrene, polyimides, or some other polymer to restrict the movement of individual particles or structures.

In an embodiment, the third layer comprises perovskite.

In an embodiment, the perovskite maybe at least one selected from the group consisting of $AMX_3$ and $A_2MX_4$ (where M is a divalent metal such as Pb or Sn, X is a halide such as Cl, Br, or I, and A is a cation which can be inorganic such as $Cs^+$ or organic $CH_3NH_3^+$, $C_4H_9NH_3^+$, $C_6H_5-C_2H_4NH_2^+$, etc.).

In an embodiment, the third layer has a methylammonium lead halide having a chemical formula of $CH_3NH_3PbX_3$, where X=I, Br or Cl.

In an embodiment, the methylammonium lead halide is $CH_3NH_3PbI_3$ having an average thickness in a range of 10-500 nm, preferably 10-400 nm, preferably 10-300 nm.

In an embodiment, the fourth layer comprises at least one selected from the group consisting of quantum dots, quantum rods, and quantum wires.

In an embodiment, the fourth layer has a thickness of 10-500 nm, preferably 10-400 nm, preferably 10-300 nm.

In an embodiment, the fourth layer comprises N-doped graphene quantum dots having 1-15%, preferably 1-10%, preferably 1-5% N doping with 1-80%, preferably 1-70%, preferably 1-60% quantum yield having an average diameter in a range of 1-50 nm, preferably 1-45 nm, preferably 1-40 nm, preferably 1-35 nm, preferably 1-30 nm, preferably 2-25 nm, preferably 2-15 nm of quantum dots. In an embodiment, the N-doped graphene quantum dots are present on the surface of the third layer at a density of 5-200/μ$m^2$, 10-150/μ$m^2$, 25-100/μ$m^2$ or 50-80/μ$m^2$.

A different carbonaceous material may be used in place of the graphene, such as carbon black (e.g., furnace black and Ketjen black), active carbon, graphite, graphene oxide, thermally reduced graphene oxide, chemically reduced graphene oxide, and mixtures thereof.

In an embodiment, the fifth layer has a thickness of 10-500 nm, preferably 10-400 nm, preferably 10-300 nm and comprises a fullerene derivative. In an embodiment, the fullerene derivative is at least one selected from the group consisting of (6,6)-phenyl-C61-butyric acid hexyl ester, phenyl C61 butyric acid methyl ester, and phenyl C71 butyric acid methyl ester.

In an embodiment, the metal is coated by electron beam deposition on the fifth layer to produce the top layer.

In an embodiment, the top layer comprising the conductive layer has an average thickness in a range of 50-500 nm, preferably 70-400 nm, preferably 100-300 nm. The conductive layer is at least one selected from the group consisting of silver, gold, copper, nickel, iron, aluminum zinc, palladium, platinum, magnesium, zirconium, titanium, vanadium, rhodium, rhenium, uranium, silicon, molybdenum, thorium, chromium, manganese, cerium, germanium, tantalum, lead, cadmium, calcium, antimony, tin, bismuth, cobalt, tungsten, indium, brass, bronze, white brass, stainless steel, indium tin oxide, cadmium tin oxide, fluorine-doped tin oxide, aluminum-doped zinc oxide, antimony-tin mixed oxide, a conductive polymer, a network of metal nanowire, a network of carbon nanowire, nanotube, nanosheet, nanorod, carbon nanotube, silver nanowire, or graphene and alloys or mixtures thereof. In an embodiment, the top layer comprises silver.

In an embodiment, the solar cell has an interfacial charge transfer resistance of $1-13\times10^5\Omega$, preferably $1-10\times10^5\Omega$, preferably $1-9\times10^5\Omega$.

In an embodiment, the solar cell has an integrated current density that is 1 to 20%, preferably 2 to 18%, preferably 3 to 15%, preferably 5 to 10% greater than PSC without N-doped graphene quantum dots.

In an embodiment, the solar cell has metal halide perovskite in the form of crystalline flakes with a mean diameter of 0.05 to 5 μm, preferably 0.05 to 3 μm, preferably 0.8 to 2 μm, preferably 0.09 to 1.5 μm, preferably 0.1 to 1 μm.

In an embodiment, the solar cell has a conversion efficiency that is 5 to 30%, preferably 10 to 25%, preferably 10 to 20% greater than a perovskite solar cell without N-doped graphene quantum dots.

In an embodiment, the solar cell has a recombination lifetime of 25 to 150 nanoseconds (ns), preferably 25 to 120 ns, preferably 25 to 100 ns, preferably 50 to 80 ns.

In an embodiment, the solar cell has an interfacial charge transfer of 1 to $15\times10^5\Omega$, preferably 1 to $13\times10^5\Omega$, preferably 2 to $11\times10^5\Omega$, preferably 3 to $10\times10^5\Omega$.

In an embodiment, the solar cell has a suppresses trap density of 2 to $15\times10^{16}$ $cm^{-3}$, preferably 3 to $13\times10^{16}$ $cm^{-3}$, preferably 3 to $10\times10^{16}$ $cm^{-3}$.

In an embodiment, the solar cell has an ideality factor (n) of 0.5 to 2.0, preferably 0.6 to 1.8, preferably 0.8 to 1.5.

In an embodiment, the solar cell has a leakage current ($J_0$) of 0.3 to $6\times10^{-16}$ amperes per centimeters square (A/$cm^2$), preferably 0.4 to $5\times10^{-16}$ A/$cm^2$, preferably 0.5 to $3\times10^{-16}$ A/$cm^2$.

In an embodiment, the PSC has the fourth layer that suppresses defect-assisted recombination.

In an embodiment, the PSC has a conductivity of 1 to $10 \times 10^{-8}$ siemens per centimeter (Scm$^{-1}$), preferably 1 to $8 \times 10^{-8}$ Scm$^{-1}$, preferably 2 to $7 \times 10^8$ Scm$^{-1}$, preferably 2 to $6 \times 10^{-8}$ Scm$^{-1}$.

In an embodiment, the solar cell has a charge carrier mobility of $5 \times 10^{-4}$ to $5 \times 10^{-3}$ cm$^2$/Vs, preferably $6 \times 10^{-4}$ to $3 \times 10^{-3}$ cm$^2$/Vs, preferably $7 \times 10^{-4}$ to $1 \times 10^{-3}$ cm$^2$/Vs.

According to a second aspect, the present disclosure relates to a method for forming the first aspect. These steps involve treating the conductive material coated glass plate in UV ozone to produce the substrate as the first layer, coating the copper doped nickel oxide on the top of the substrate to produce the second layer, coating the perovskite on the second layer to produce the third layer, coating a solution of N-doped graphene quantum dots on the third layer to produce the fourth layer, coating the fullerene derivative on the fourth layer to produce the fifth layer, and coating the conductive layer on the fifth layer to produce the top layer.

Referring to FIG. 1, a schematic flow diagram of a method 100 for producing the perovskite solar cell (PSC) is illustrated. The order in which the method 100 is described is not intended to be construed as a limitation, and any number of the described method steps may be combined in any order to implement the method 100. Additionally, individual steps may be removed or skipped from the method 100 without departing from the spirit and scope of the present disclosure.

At step 102, the method 100 includes treating the indium tin oxide coated glass plate in ultraviolet (UV) ozone to produce the substrate as the first layer.

In an embodiment, the substrate is cleaned with at least one soap solution, water, alcohol, and acetone before the treatment of the indium tin oxide coated glass plate in UV ozone.

At step 104, the method 100 includes coating the copper-doped nickel oxide on the top of the substrate to produce the second layer.

In an embodiment, copper-doped nickel oxide is synthesized via the thermal decomposition method.

The copper-doped nickel oxide is made with mixing a nickel salt, preferably at least one selected from the group consisting of nickel borate, nickel bromide, nickel carbonate, nickel chloride, nickel fluoride, nickel nitrate, nickel oxalate, nickel oxide, nickel acetate, nickel phosphate, preferably nickel nitrate, a copper salt, preferably at least one selected from the group consisting of copper borate, copper bromide, copper carbonate, copper chloride, copper fluoride, copper nitrate, copper oxalate, copper oxide, copper acetate, copper phosphate, preferably copper nitrate and an alcohol, preferably methanol to produce a first mixture; adding an aqueous solution of sodium hydroxide to the first mixture to produce the second mixture; washing a precipitate of the second mixture; heating the precipitate to form the copper doped nickel oxide.

At step 106, the method 100 includes coating the perovskite on the second layer to produce the third layer.

At step 108, the method 100 includes coating a solution of N-doped graphene quantum dots on the third layer to produce the fourth layer.

The solution of N-functionalized graphene quantum dots is made by mixing a graphene oxide solution (GO) with a polyethyleneimine solution (PEI) to achieve PEI/GO volume ratio of 10 to 50, preferably 10 to 30, preferably 20, and stirring the mixture at 50 to 120° C., preferably 60 to 100° C., preferably 70 to 100° C., preferably 80 to 100° C., preferably 90° C. for 1 to 10 hours, preferably 2 to 8 hours, preferably 2 to 6 hours, preferably 4 hours to functionalize the GO with nitrogen. The N-functionalized GO is heated at 100 to 500° C., preferably 200 to 400° C., preferably 300° C. for 0.5 to 3 hours, preferably 0.5 to 2 hours, preferably 1 hour. The N-functionalized GO is dispersed in organic solvent, preferably chlorobenzene by sonication to produce the solution of N-functionalized graphene quantum dots.

In an embodiment, the solution of N-doped graphene quantum dots is coated on the third layer by thermal annealing at 50-200° C., preferably 80-180° C., preferably 80-150° C., preferably 80-120° C., preferably 90-110° C. to produce the fourth layer.

At step 110, the method 100 includes coating the phenyl-C61-butyric acid methyl ester (PCBM) on the fourth layer to produce the fifth layer.

At step 112, the method 100 includes coating the silver on the fifth layer to produce the top layer.

The foregoing paragraphs have been provided by way of general introduction, and are not intended to limit the scope of the following claims. The described embodiments, together with further advantages, will be best understood by reference to the following detailed description taken in conjunction with the accompanying drawings.

EXAMPLES

The following examples describe and demonstrate exemplary embodiments of passivation of perovskite solar cells described herein. The examples are provided solely for illustration and are not to be construed as limitations of the present disclosure, as many variations thereof are possible without departing from the spirit and scope of the present disclosure.

Materials

Nickel nitrate hexahydrate, copper nitrate trihydrate, zinc acetate dihydrate, sodium hydroxide, perovskites grade lead iodide, methylammonium iodide (MAI, CH$_3$NH$_3$I), and PCBM were purchased from Sigma Aldrich. The anhydrous solvents chlorobenzene, N, N-dimethylformamide (DMF), and isopropanol were also purchased from Sigma Aldrich.

Synthesis of NGQDs

Graphene oxide solution was prepared by dissolving synthesized GO in deionized (DI) water with a concentration of 4.0 milligram per milliliters (mg/ml) and ultrasonicated for 4 hours. In the prepared GO solution, polyethyleneimine solution (PEI, MW=1800, 0.5 gram per milliliters (g/mL) in DI water) was added to achieve PEI/GO volume ratio of 20, followed by stirring at 90 degrees centigrade (° C.) for 4 hours to functionalize the GO with nitrogen. The N-functionalized GO was heated at 300° C. for 1 hour in a horizontal furnace under ambient Air followed by freeze-drying. The obtained product was dispersed in chlorobenzene by sonication. Finally, the dispersed solution was filtered using a 0.1 micrometer (μm) PTFE syringe filter to obtain a light-yellow solution of N-functionalized graphene quantum dots with ultra-high quantum yield.

Device Fabrication

Indium Tin Oxide (ITO) coated glass substrates were cleaned by successive ultrasonication in a soap solution, DI water, ethanol, and acetone. The cleaned substrates were treated in UV ozone for 10 min. On top of the cleaned ITO, three layers of synthesized nickel oxide:copper (NiO:Cu) hole transport layer (HTL) were spin-casted at 4000 revolutions per minute (rpm) for 30. On top of HTL, perovskites films were fabricated via a two-step method. So, PbI$_2$ and CH$_3$NH$_3$I solution were prepared in anhydrous DMF (462 mg/ml) and anhydrous isopropanol (6 mg/mL), respectively. As a first step, the PbI$_2$ solution was spin-casted on top of fabricated NiO:Cu film at 3000 rpm for 20 seconds, followed by thermal annealing for 5 min at 100° C. When PbI$_2$ films cooled to room temperature, MAI films were spin-casted at 4000 rpm for 30 seconds by dispensing 200 μL of CH$_3$NH$_3$I solution. During the last 10 seconds of the CH$_3$NH$_3$I spinning process, 80 μL of NGQDs solution was poured on spinning substrates as a passivation layer followed by thermal annealing at 100° C. for 10 min to achieve the MAPbI$_3$ perovskites films. The ETL was deposited on top of MAPbI$_3$ film by spin-casting of PCBM solution (20 mg/mL in chlorobenzene) at 1000 rpm for 60 seconds. Finally, back contact was applied on top of the PCBM layer via E-beam deposition of Ag metal of ☐ 150 nm. The electron-only device was fabricated on FTO coated glasses substrates and cleaned. On top of cleaned FTO substrates, an undoped ZnO hole blocking layer was prepared using the atomic layer deposition (ALD) followed by spin-casting of synthesized ZnO nanoparticles. The MAPbI$_3$, PCBM, and NGQD layers were deposited. Finally, back contact of 1.5 μm thickness was applied by e-beam evaporation of Al metal.

Characterization

Hitachi FETEM, HF-3300, and Hitachi FESEM, S-4800 were, respectively, employed to record the high-resolution images of the NGQDs and surface morphology of perovskites films. X-ray crystallography (XRD) pattern perovskites films were recorded via Panalytical HR-XRD system having Cu/Kα radiation of λ=1.5406 angstroms (Å). The perovskites films were excited with a wavelength of 405 nm to measure the PL steady-state emission and TRPL decay spectra through Hamamatsu, C10627 fluorescence lifetime measurement system. The solar cell's performance parameters were evaluated from J-V characteristics measured through Keithley, 2400 source meter, and devices were illuminated through New-port, 91192 solar simulators. An External Quantum Efficiency (EQE) of fabricated devices was determined via the IPCEX7 series IPCE measurement system made by PV Measurements, Inc., USA. The EIS was measured through VersaSTAT3 Potentiostate (M/s. Princeton Applied Research, USA) from 0.5 hertz (Hz) to 1 megahertz (MHz) and ac perturbation of 10 millivolts (mV).

Characterization of PVSK Layer

Figure 2A:
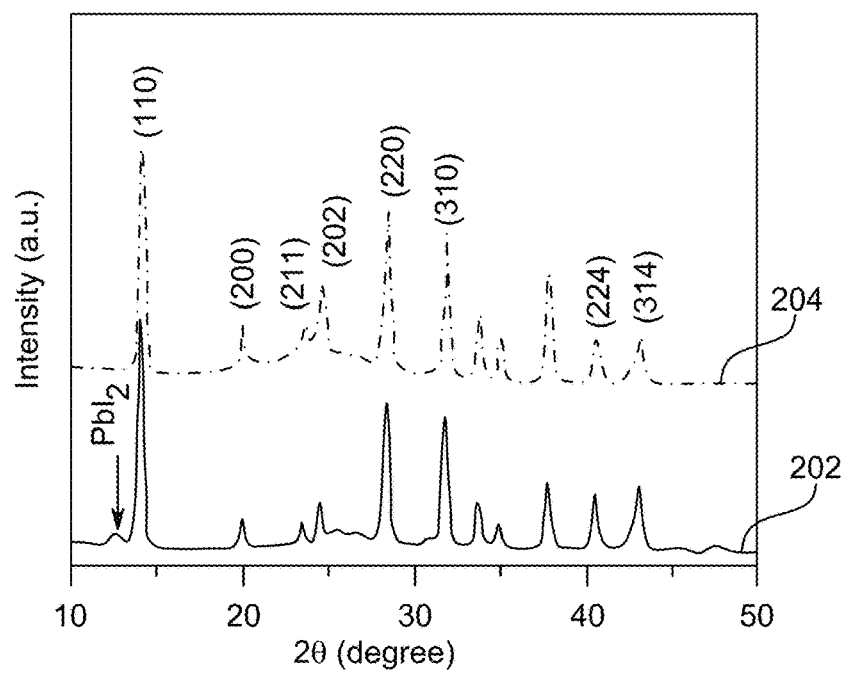
FIG. 2A illustrates an X-ray crystallography (XRD) spectrum of without and with graphene quantum dots (GQDs) passivated methylammonium lead iodide (MAPbI$_3$) perovskites films, according to certain embodiments.

FIG. 2A illustrates an XRD spectra of methylammonium lead iodide (MAPbI$_3$) perovskites thin films 204 and without passivated methylammonium lead iodide (MAPbI$_3$) perovskites thin films 202. The diffraction peaks observed at 2θ=14.05°, 19.99°, 23.45°, 24.55°, 28.45°, 31.85°, 40.55°, and 43.55° are corresponding to (110), (200), (211), (202), (220), (310), (224), and (314), respectively of tetragonal phase of MAPbI$_3$. Passivation treatment of PVSK layer 204 resulted in all peaks slightly (0.02°-0.2°) shifted to a higher angle compared to without passivated PVSK layer 202 (represented as PVSK). The shift towards higher diffraction angles implied a decrease in the lattice plane distance attributed to a more crystalline structure. Expectedly, no significant changes in the main diffraction peaks correspond to (110) and (220) plane of MAPbI$_3$ perovskites films with or without passivation were noticed, indicating that the passivation treatment does not influence the major crystal structure of perovskite. The peak observed at 12-13.5° without passivated perovskites film was corresponding to excess PbI$_2$, which was absent in passivated PVSK layer (PVSK-NGQD).

Figure 2B:
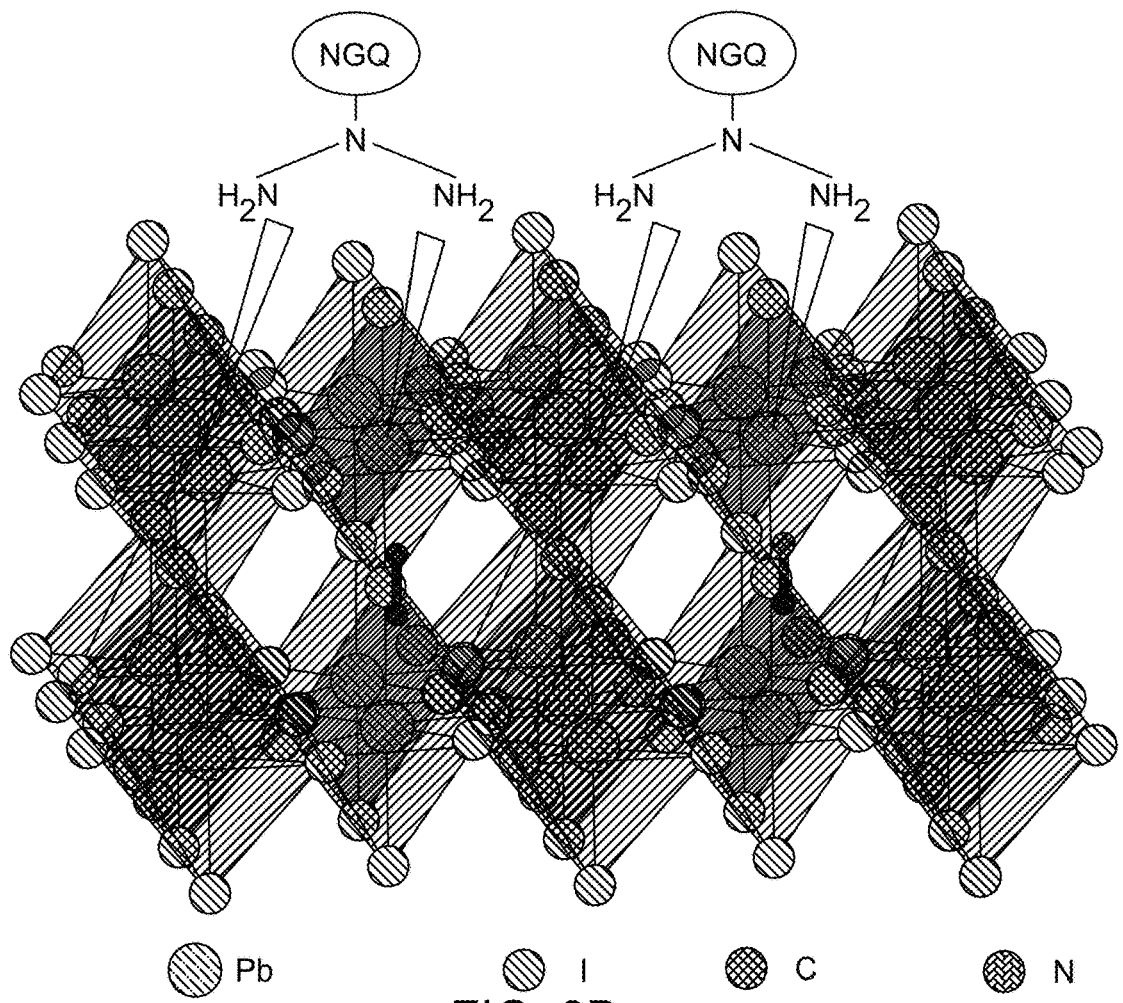
FIG. 2B illustrates an interaction between perovskites and N-doped GQDs, according to certain embodiments.
Figure 2C:
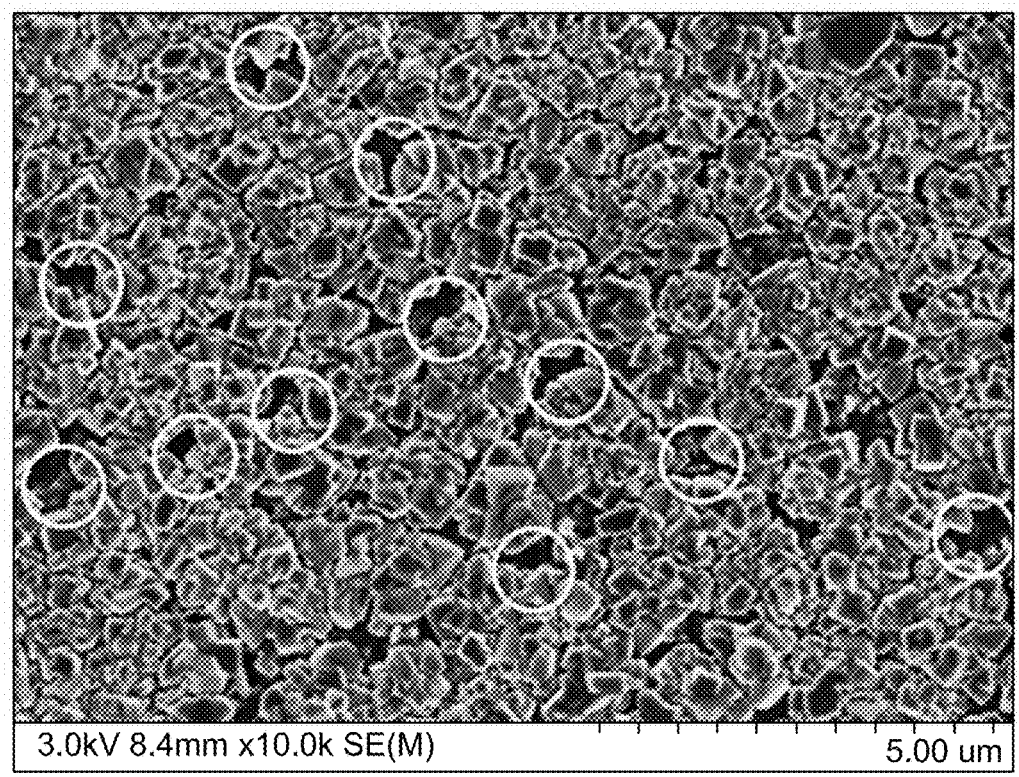
FIG. 2C illustrates a scanning electron microscope (SEM) image without the perovskites layer, according to certain embodiments.
Figure 2D:
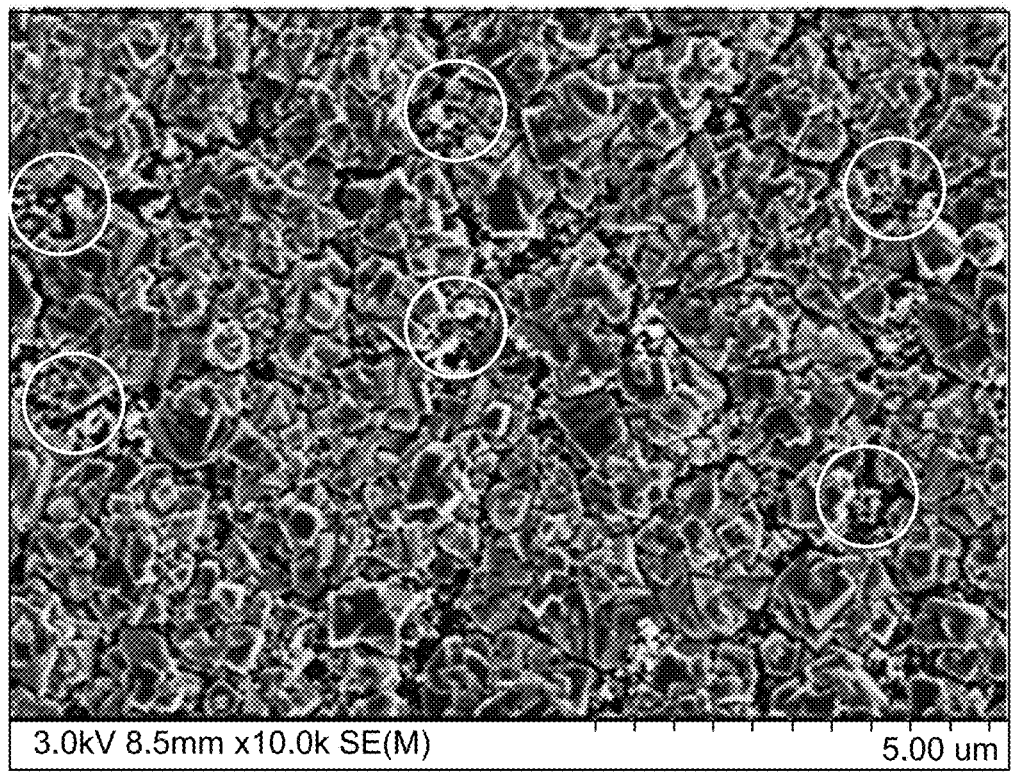
FIG. 2D illustrates SEM image of with passivated perovskites layer, according to certain embodiments.

FIG. 2B schematically illustrates the interactions between N-doped GQDs and PVSK. The lone pair electron of N interacts with uncoordinated Pb$^{2+}$ and passivating uncoordinated Pb$^{2+}$ defect states. FIGS. 2C-2D illustrate the Scanning electron microscope (SEM) images of without and with passivated PVSK layers, respectively. The SEM images of the PVSK layer showed crystalline flakes of uniform grain size. There were some cracks in the un-passivated PVSK layer, which were visible (white circles) between grains. These cracks acted as nonradiative recombination centers and caused deteriorated device performance. In passivated PVSK layer, the gaps were passivated by NGQD via interaction between lone pair of N and Pb$^{2+}$ as shown in FIG. 2B.

Figure 3A:
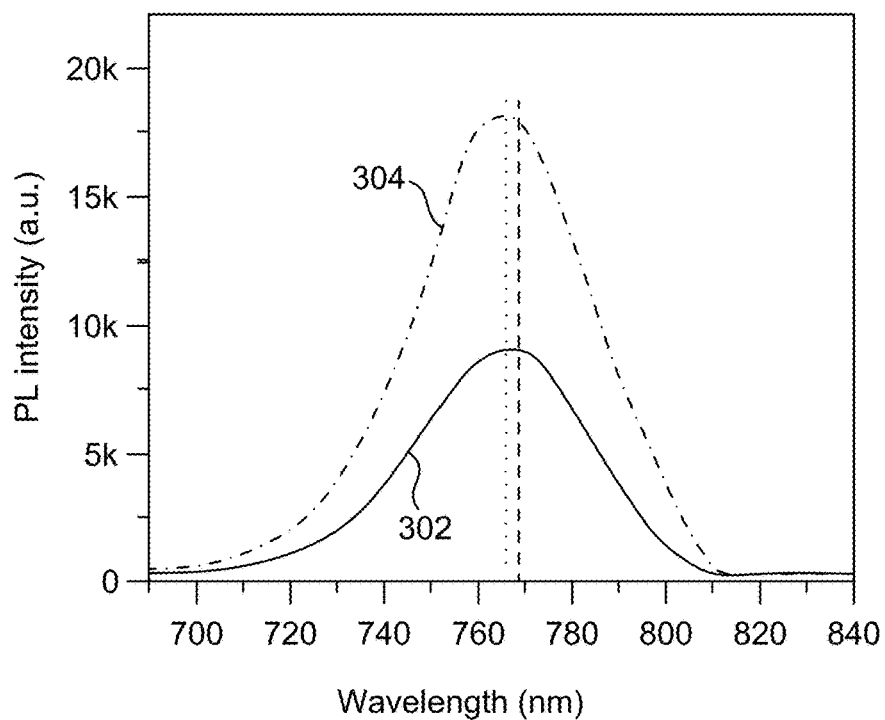
FIG. 3A illustrates steady-state photoluminescence (PL) spectrum of the un-passivated and passivated metal halide perovskites (PVSK) layers, according to certain embodiments.
Figure 3B:
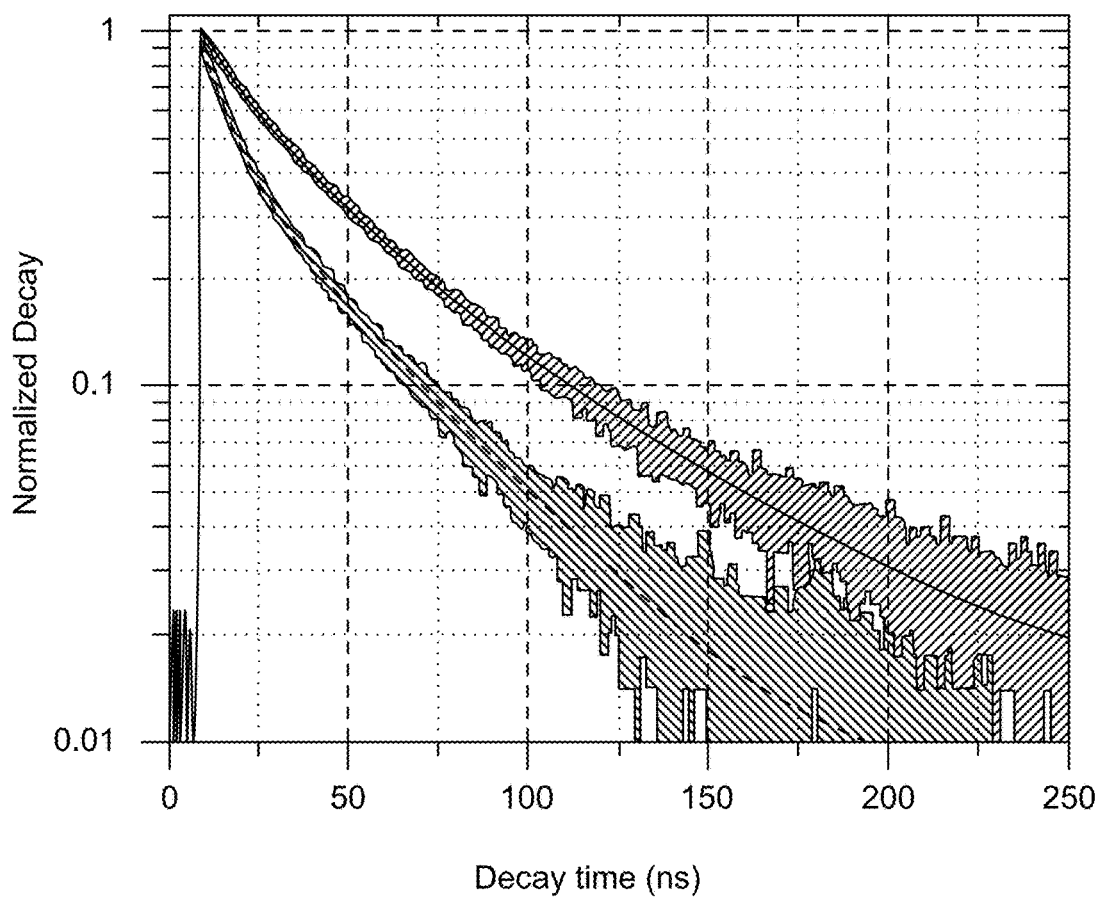
FIG. 3B illustrates a time-resolved PL spectrum of the un-passivated and passivated PVSK layers, according to certain embodiments.

FIG. 3A illustrates a steady-state photoluminescence (PL) spectra of passivated 304 and un-passivated 302 MAPbI$_3$ perovskites films. The PL spectra of the NGQD passivated PVSK layer 304 exhibited a shift of 3 nm and enhancement in PL intensity as compared to the un-passivated PVSK layer 302. An enhancement in the PL intensity of the passivated PVSK layer 304 confirmed the suppression of nonradiative recombination channels due to the passivation of surface defects through NGQD. The shift in PL spectra also confirmed the good passivation with trap states. Time-resolved photoluminescence (TRPL) spectra were measured to investigate the impact of NGQD passivation on nonradiative recombination centers in the PVSK layer. FIG. 3B illustrates PL decay in NGQDs passivated perovskites is slower than the PVSK layer without passivation. The decay spectra were fitted with a two-component exponential decay model as given in equation (1).

$$I(t) = A_0 + A_1 e^{-t/\tau_1} + A_2 e^{-t/\tau_2} \qquad (1)$$

where A$_1$, A$_2$ are fitting constants attributed to PL decay intensity, τ$_1$, and τ$_2$ are lifetimes of charge carriers. The obtained lifetimes and amplitudes are listed in Table 1. The average lifetime (τ$_{avg}$) was evaluated through the equation (2).

$$\tau_{avg} = \frac{A_1 \tau_1^2 + A_2 \tau_2^2}{A_1 \tau_1 + A_2 \tau_2} \qquad (2)$$

The obtained values of τ$_{avg}$ of the un-passivated PVSK and PVSK-NGQD are 31.7 and 59.9 ns, which indicated that the value of τ$_{avg}$ of the PVSK-NGQD layer was more than twice the τ$_{avg}$ of un-passivated PVSK. Thus, the obtained result confirmed the mitigation of nonradiative recombination centers in the PVSK-NGQD layer.

TABLE 1

TRPL decay fitting parameters of PVSK and PVSK-NGQD layers

| Sample | τ$_1$ (ns) | A$_1$ | τ$_2$ (ns) | A$_2$ | τ$_{avg}$ (ns) |
|---|---|---|---|---|---|
| PVSK | 9.37 | 1.47 | 46 | 0.47 | 31.7 |
| PVSK-NGQD | 24.72 | 1.02 | 91.26 | 0.31 | 59.9 |

Device Performance

Figure 4A:
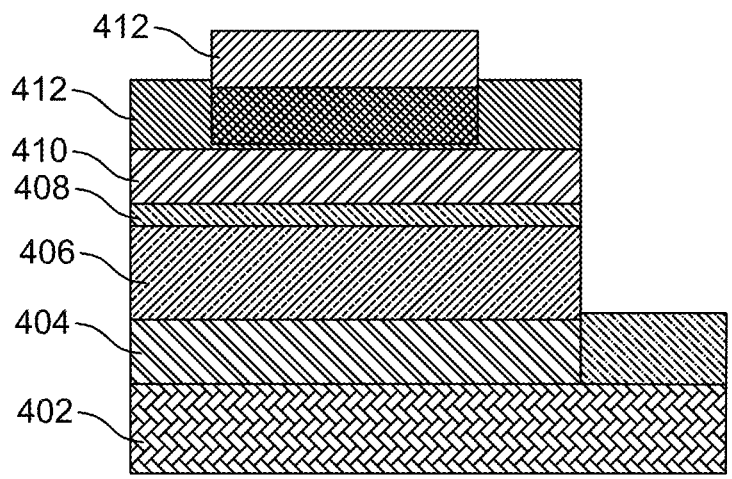
FIG. 4A illustrates a device configuration of nitrogen-doped graphene quantum dots (N-GQD) passivated perovskites solar cells, according to certain embodiments.
Figure 4B:
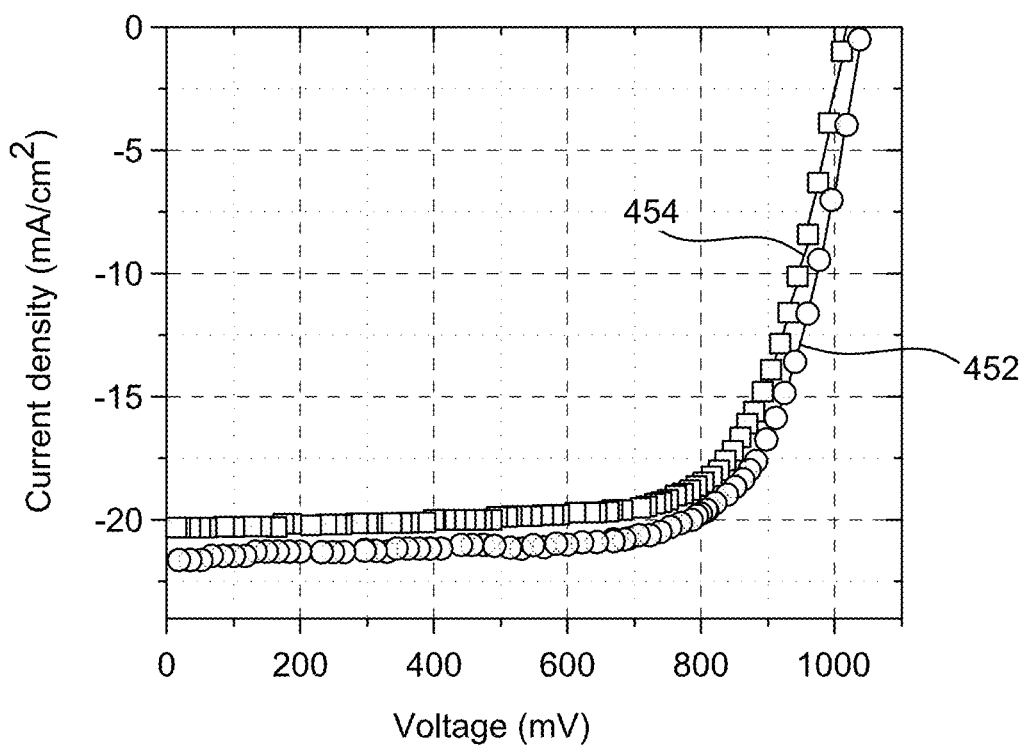
FIG. 4B illustrates an illuminated current density-voltage (J-V) characteristic of fabricated perovskites solar cells, according to certain embodiments.

FIG. 4A illustrates the PSCs in the current experiment that were fabricated in a planer inverted p-i-n structured viz. indium tin oxide (ITO)/NiO:Cu/CH$_3$NH$_3$PbI$_3$/PCBM/Ag and ITO 402/NiO:Cu 404/CH$_3$NH$_3$PbI$_3$ 406/N-GQDs 408/PCBM 410/Ag 412. FIG. 4B illustrates the measured J-V characteristics under illumination and the corresponding performance parameters for perovskites solar cells 452 with and without passivation 454. The control device yielded a decent η of 15.03% with a short circuit current density (J$_{SC}$) of 20.42 mA·cm$^{-2}$, V$_{OC}$ of 1.017 V, and FF of 0.724. The results revealed that the improvement in the η was ☐ 13.8% after insertion of the NGQD passivating in between the PVSK and electron transporting layer (ETL). Thus, the achieved efficiency of the passivated PVSK-based solar cell (PSC-NGQD) was 17.10%. The improved device performance was mainly observed due to an increase of $J_{SC}$ (~6.0% relative to control cell) to 21.64 mA/cm$^2$ and FF (from 72.4% to 75.9%), whereas a slight increment in $V_{OC}$ of 0.02 V was found. Thus, it was confirmed that the insertion of the NGQDs does not impact the electronic structure of the PSCs. The improved $J_{SC}$ primarily occurs due to improved charge transfer between PVSK/ETL interfaces, however, a slight enhancement in the $V_{oc}$ was attributed to passivation of nonradiative recombination centers at the PVSK/ETL interface as confirmed through the enhanced PL intensity and longer carrier lifetime of passivated perovskites in compared to non-passivated PVSK layer (FIGS. 3A and 3B).

Figure 4C:
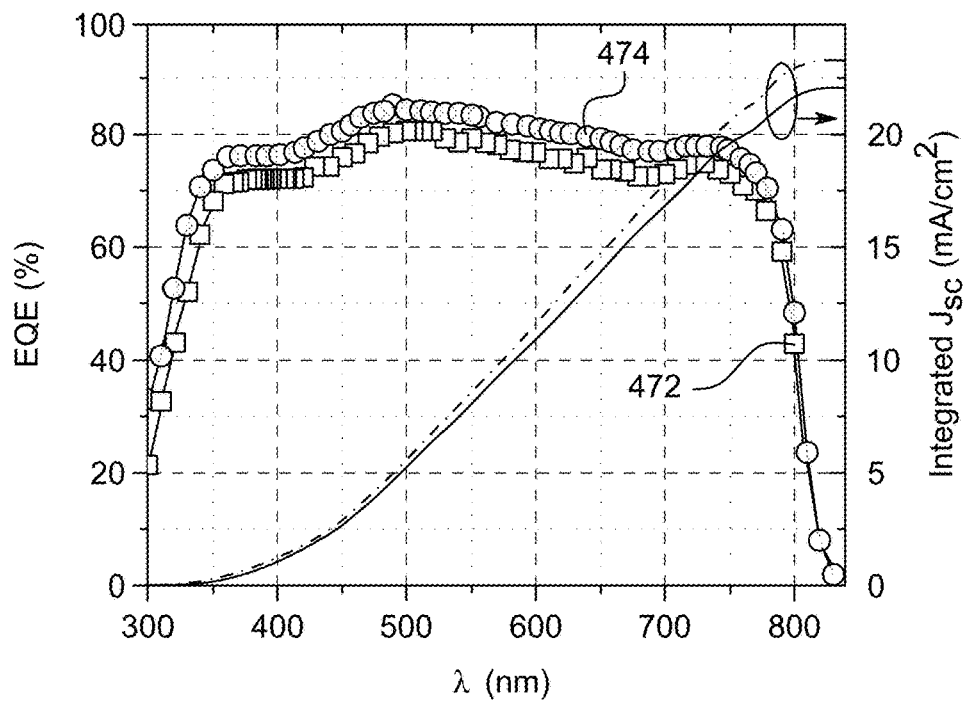
FIG. 4C illustrates an external quantum efficiency (EQE) graph and corresponding integrated current density, according to certain embodiments.

FIG. 4C illustrates the external quantum efficiency (EQE) spectra and integrated current densities ($J_{sc}$) obtained by integrating the EQE spectra over the solar spectrum. The integrated current densities obtained from the EQE spectra for passivated 472 and without passivated 474 devices were 21.58 mA·cm$^{-2}$ and 20.39 mA·cm$^{-2}$, respectively, which were consistent with the results obtained from the J-V measurement.

Figure 5:
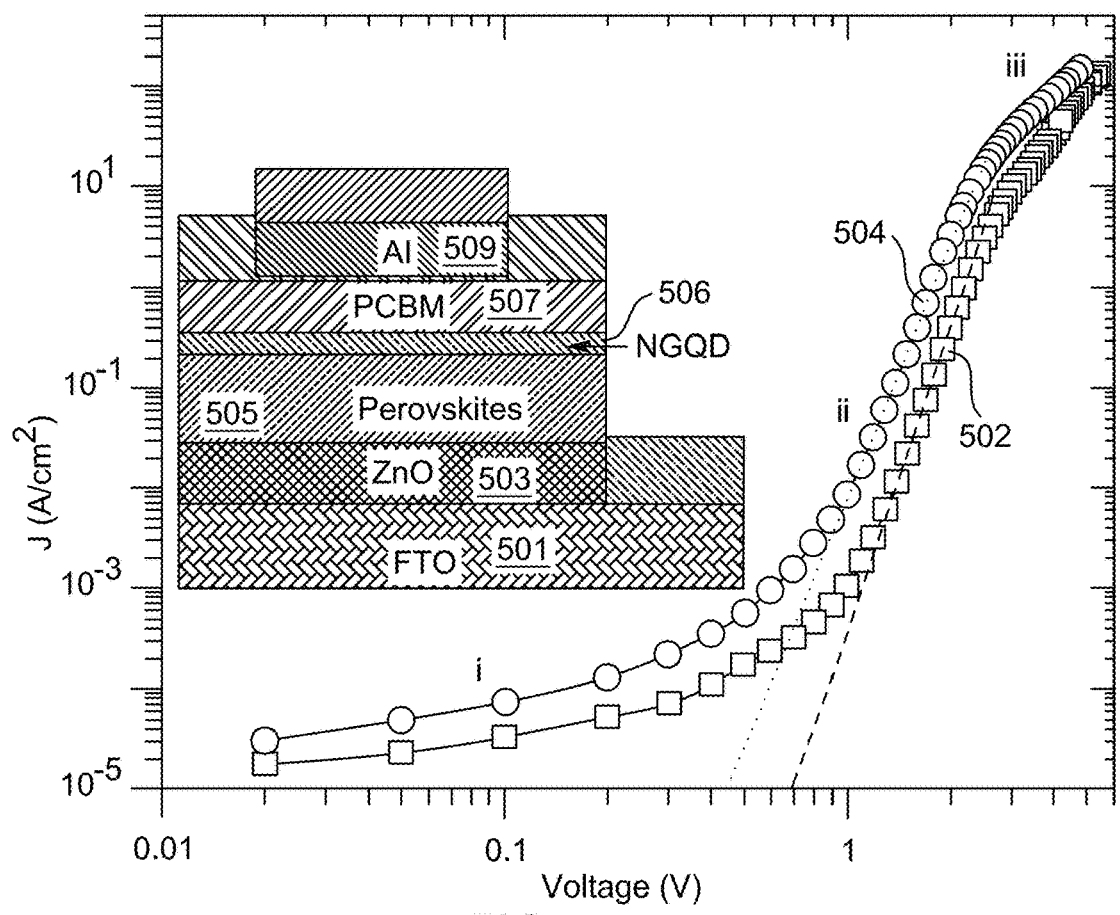
FIG. 5 illustrates a Dark J-V characteristic of passivated and without passivated perovskites thin films in electron-only device configuration, according to certain embodiments.

FIG. 5 illustrates the improved device performance of NGQD passivated device, the defect density and electrical parameters from the dark J-V characteristics of un-passivated 502 and passivated PVSK layer 504 were evaluated using an electron-only device configuration viz. fluorine-doped tin oxide (FTO)/ZnO/CH$_3$NH$_3$PbI$_3$/PCBM/Al and FTO 501/ZnO 503/CH$_3$NH$_3$PbI$_3$ 505/N-GQDs 507/PCBM 509/Al 511, respectively. The measured dark J-V characteristics exhibited three regions: (i) ohmic (ii) trap filling and (iii) trap filled. The electrical conductivity was estimated from the region (i) through the relation equation (3), $$\sigma = JL/V \quad (3)$$

where L is the thickness of the perovskites layer.

The conductivity of the un-passivated PVSK layer was calculated to be $1.01 \times 10^{-8}$ Scm$^{-1}$ which slightly increased to $2.63 \times 10^{-8}$ Scm$^{-1}$ when passivated with N-GQDs. On the further increase of applied bias, the injected carrier starts filling the traps and current density rapidly increases (region ii). When all trap states are occupied by injected charge carriers, the current growth rate [d(J)/d(V)] decreases. Total trap density H$_t$ was evaluated from the crossover voltage VC shown in FIG. 5 using equation (4):

$$V_C = f(l) \frac{qL^2 H_t}{\varepsilon_r \varepsilon_0} \quad (4)$$

where q, $\varepsilon_0$, and $\varepsilon_r$ are the electronic charge, permittivity, and dielectric constant of the PVSK layer, respectively.

It was noted from FIG. 5 that the crossover voltage for passivated perovskites device was decreased to 2.48 V in comparison to 2.88 V for the un-passivated device. The determined values of the corresponding trap densities are $5.53 \times 10^{16}$ cm$^{-3}$ and $4.68 \times 10^{16}$ cm$^{-3}$, respectively. A decrease in trap density confirms the passivation of defects by NGQD. Region (ii) was found to be well fitted (solid black line) with exponentially distributed trap limited space charge limited conduction (SCLC) equation (5):

$$J = q^{1-l} \mu N_C \left(\frac{2l+1}{l+1}\right)^{l+1} \left(\frac{l}{l+1} \frac{\varepsilon_r \varepsilon_0}{H_t}\right)^l \frac{V^{l+1}}{L^{2l+1}} \quad (5)$$

where μ is the charge carrier mobility, $N_C$ is the effective density of states at the edge of the conduction band, and l is a characteristics parameter to determine the characteristic trap energy from the relation $E_t = lk_B T$, where $k_B$ is the Boltzmann's constant and T is temperature.

The parameters used to fit the J-V curve using the above equation are given in Table 2. In passivated devices, both mobility (μ) and conductivity (σ) slightly improved while traps become shallower as compared to without passivated devices. Further, free carrier concentration ($n_c$) was estimated from the equation (6):

$$n_c = \sigma/q\mu \quad (6)$$

The value of $n_c$ is found to be increased by about one order in passivated device further confirming the defect passivation through NGQD.

TABLE 2

The electrical parameters for un-passivated and NGQDs passivated PVSK layers

| Parameters | σ (Σ/χμ) | $V_C$ (V) | $H_t$ (cm$^{-3}$) | $E_t$ (eV) | μ (χμ$^2$/ζ σ) | $N_C$ (cm$^{-3}$) | $N_c$ (cm$^{-3}$) |
|---|---|---|---|---|---|---|---|
| PVSK | $1.01 \times 10^{-8}$ | 2.88 | $5.53 \times 10^{16}$ | 0.233 | $5.10 \times 10^{-4}$ | $5.0 \times 10^{18}$ | $5.74 \times 10^{14}$ |
| PVSK-NGQD | $2.63 \times 10^{-8}$ | 2.48 | $4.68 \times 10^{16}$ | 0.19 | $8.30 \times 10^{-4}$ | $2.0 \times 10^{18}$ | $1.37 \times 10^{15}$ |

To further elucidate the impact of NGQD passivation on charge recombination, the values included of photovoltaic (PV) cell parameters including photocurrent ($J_{ph}$), shunt resistance ($R_{sh}$), series resistance ($R_s$), ideality factor (n), and reverse saturation current density ($J_0$) were analytically predicted. These parameters provide information about the losses that occur in solar cells. An analytical method was used to predict the PV cell parameters as reported previously, which uses the values of the slopes at the short circuit ($m_{sc}$=dJ/dV at V=0, J=$J_{sc}$) and open circuit ($m_{oc}$=dJ/dV at V=$V_{oc}$, J=0) conditions. Additionally, the values of voltage ($V_m$) and current ($J_m$) at maximum power point were also required. The values of $J_{sc}$, $V_{oc}$, $J_m$, $V_m$, $m_{sc}$, and $m_{oc}$, (listed in Table 3) are used in the eq. (7-11). The obtained values of the PV cell parameters are listed in Table 4. The value of $J_{ph}$ was found to be higher for the passivated device compared to the control device. The shunt resistor represents the current loss due to the recombination of charge carriers and leakage current. $R_{sh}$ was found to be increased from 1023.77 Ωcm$^2$ for un-passivated PSC to 1076.81 Ωcm$^2$ for the passivated cell, indicating suppression of recombination losses when passivated with the NGQDs. However, the value of $R_s$ was reduced from 4.675 to 4.025 Ωcm$^2$ via insertion of the NGQDs layer, which again confirms that the insertion of the NGQD layer in the PSC slightly improves the charge transportation. Thus, overall combined resistance of the PSC was reduced. The n value for un-passivated PSC was calculated to be 1.611, which is significantly reduced to 1.241 for NGQD passivated PSC, further affirming the reduction of recombination defects in the PVSK layer due to NGQD passivation.

The reverse saturation current density was simply represented by the leakage current. The current flows in the opposite direction due to asymmetry in the energy levels of different layers of perovskites solar cells required for charge splitting. The current flow in the opposite direction led to net photocurrent reduced from $J_0$, which should be minimized. The ideality factor and leakage current provide information about interfacial charge recombination at PVSK/CTL. It might be noted from Table 3 that the passivated device has a lower leakage current of $4.244 \times 10^{-13}$ A/cm$^2$ compared to without passivated device with $J_0$ of $1.368 \times 10^{-16}$ A/cm$^2$. The reduced value of n and $J_0$, is attributed to decreased carrier recombination in the passivated device.

TABLE 3

Photovoltaic parameters of control and passivated perovskites solar cells

| | $m_{sc}$ (Ohm·cm$^2$)$^{-1}$ | $m_{oc}$ (Ohm·cm$^2$)$^{-1}$ | $J_m$ (mAcm$^{-2}$) | $V_m$ (mV) | $J_{ph}$ (mAcm$^{-2}$) | $R_{sh}$ (W·cm$^2$) | $R_S$ (W·cm$^2$) | n | $J_0$ (Acm$^{-2}$) |
|---|---|---|---|---|---|---|---|---|---|
| PVSK | $9.768 \times 10^{-4}$ | 0.1469 | 18.462 | 813.75 | 20.51 | 1023.77 | 4.675 | 1.611 | $4.244 \times 10^{-13}$ |
| PVSK-NGQD | $9.287 \times 10^{-4}$ | 0.1796 | 19.595 | 872.56 | 21.72 | 1076.81 | 4.025 | 1.241 | $1.368 \times 10^{-16}$ |

Figure 6:
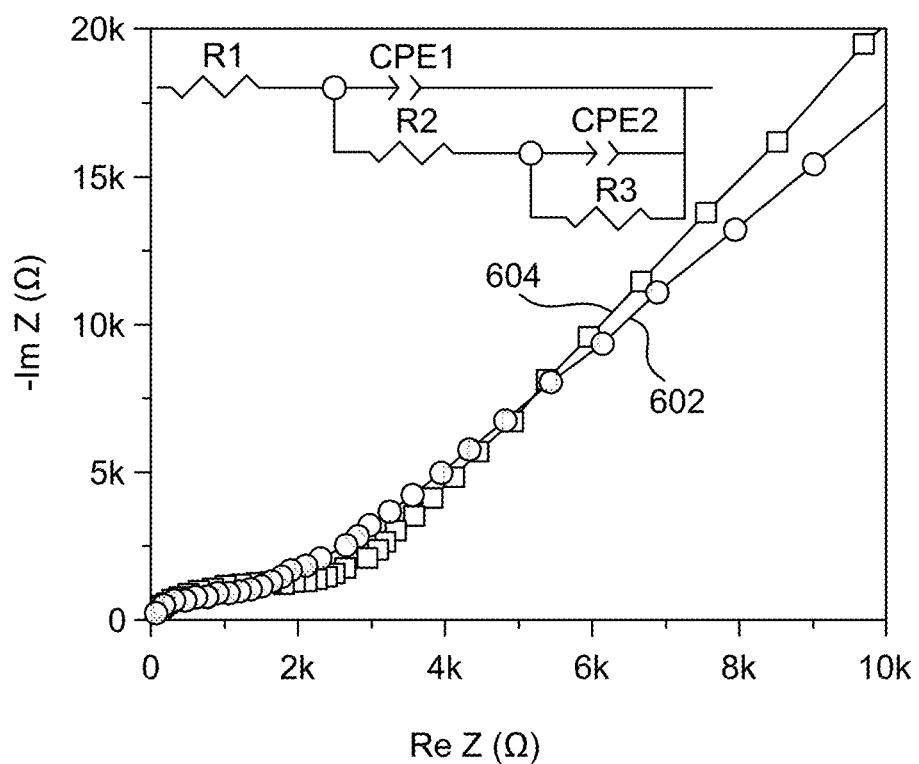
FIG. 6 illustrates an impedance spectrum of passivated and passivated perovskites solar cells (in the inset: equivalent circuit used for fitting the impedance spectra), according to certain embodiments.

Electrochemical impedance spectroscopy (EIS) is a powerful technique to analyze the interface of perovskite solar cells. FIG. 6 illustrates the impact of NGQDs passivation 602 and un-passivation 604 on interfacial charge transfer and recombination process in perovskites solar cells measuring EIS spectra. EIS spectra showed an arc at high frequency and a linear region at low frequency. The equivalent circuit shown in the inset of FIG. 6 was used to fit the experimental EIS spectra, where $R_1$ is the series resistance due to contact, constant phase element (CPE); CPE1 and CPE2 were the capacitance high and low-frequency capacitance, respectively. The capacitance $C_1$ corresponds to the geometrical capacitance of the perovskites layer was evaluated to be $1.04 \times 10^{-8}$ F for both passivated and non-passivated devices (using equation (7)). The charge transport resistance $R_2$ in bulk perovskites was noted to drop to $1742\Omega$ after NGQDs passivation compared to $2661\Omega$ for the control device. The capacitance $C_2$ corresponds to low-frequency mechanisms including ionic transport, interfacial charge accumulation, and the transport was slight decreases from $2.98 \times 10^{-8}$ to $1.94 \times 10^{-8}$ F (using equation (8)). The decrease in interfacial capacitance indicated the decrease of interfacial charge accumulation due to defect passivation. The interfacial charge transfer resistance $R_3$ was noted to be decreased by around one order from $1.39 \times 10^6 \Omega$ to $6.071 \times 10^5 \Omega$, indicating passivation improves the charge carrier dynamics between perovskites and the electron transport layer.

Synthesis of ZnO Nanoparticles

The Zn-precursor solution was prepared by stirring zinc acetate dihydrate (26.8 mmol) in 250 mL of methanol. When zinc acetate dihydrate completely dissolved, KOH/methanol mixture solution was dropwise added into Zn-precursor solution and continuously stirred for another 4 hours at 65° C. When the reaction was accomplished, the precipitate ZnO nanoparticles (NPs) were washed several times with methanol and dispersed in n-butanol.

Synthesis of NiO:Cu Nanoparticles

Copper-doped nickel oxide NPs were synthesized via the thermal decomposition method. First, 0.95 mmoles of nickel (II) nitrate hexahydrate [Ni(NO$_3$)$_2$·6H$_2$O] and 0.05 mmole of cupric nitrate trihydrate [Cu(NO$_3$)$_2$·3H$_2$O], both purchased from Sigma-Aldrich, were dissolved in 10 mL methanol, and stirred for 2 hours at 65° C. Then, sodium hydroxide (NaOH) solution was dropwise added to it until the pH value of solution became more than 10, followed by further stirring until the solution color turned green. The precipitate of the solution was washed several times in methanol by centrifuge and dried in an oven at 70° C. for 2 days. The dried product was further heated at 400° C. in the air for 1 hour to achieve the NiO:Cu NPs and finally dispersed in n-butanol.

Characterization of GQDs

Figure 7A:
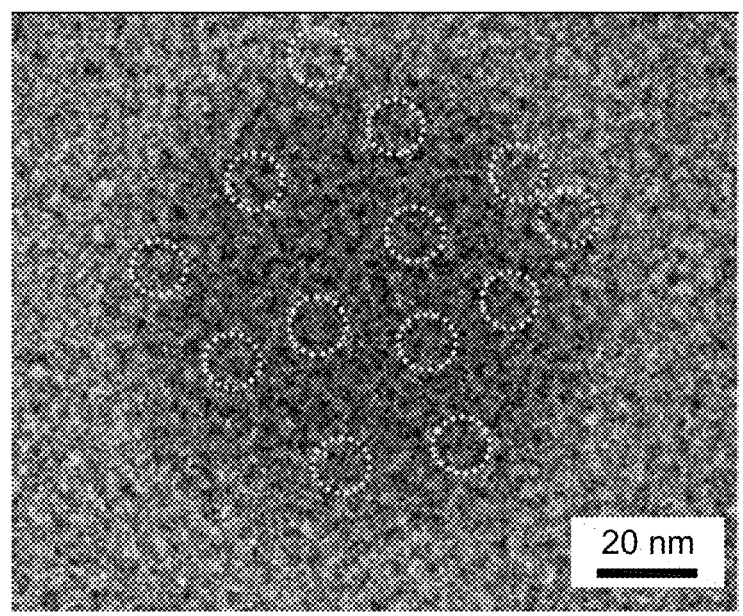
FIG. 7A illustrates a Transmission electron microscope (TEM) image of N-doped GQDs, according to certain embodiments.
Figure 7B:
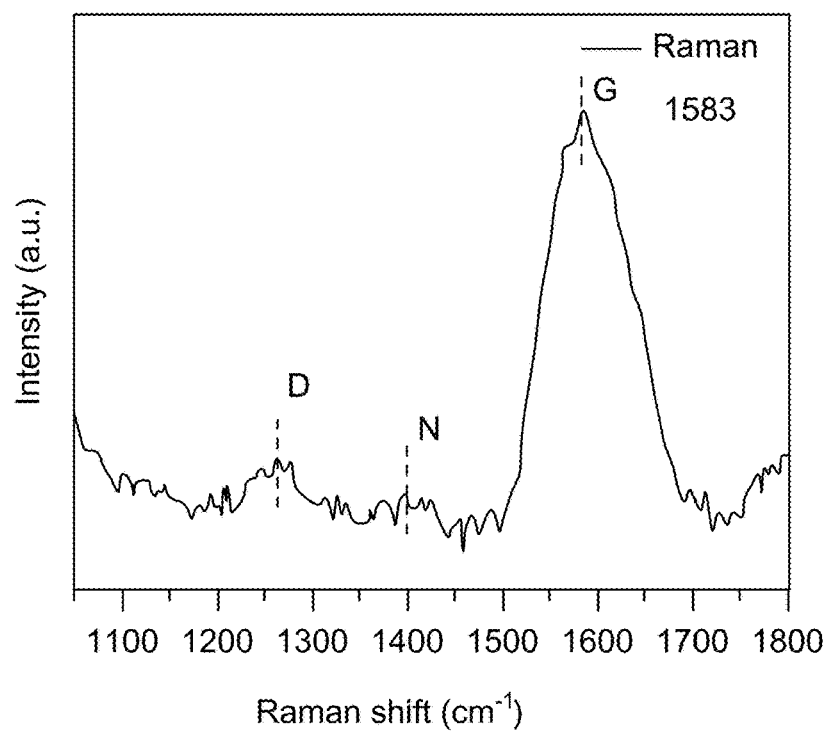
FIG. 7B illustrates a Raman spectrum of N-doped GQDs, according to certain embodiments.
Figure 7C:
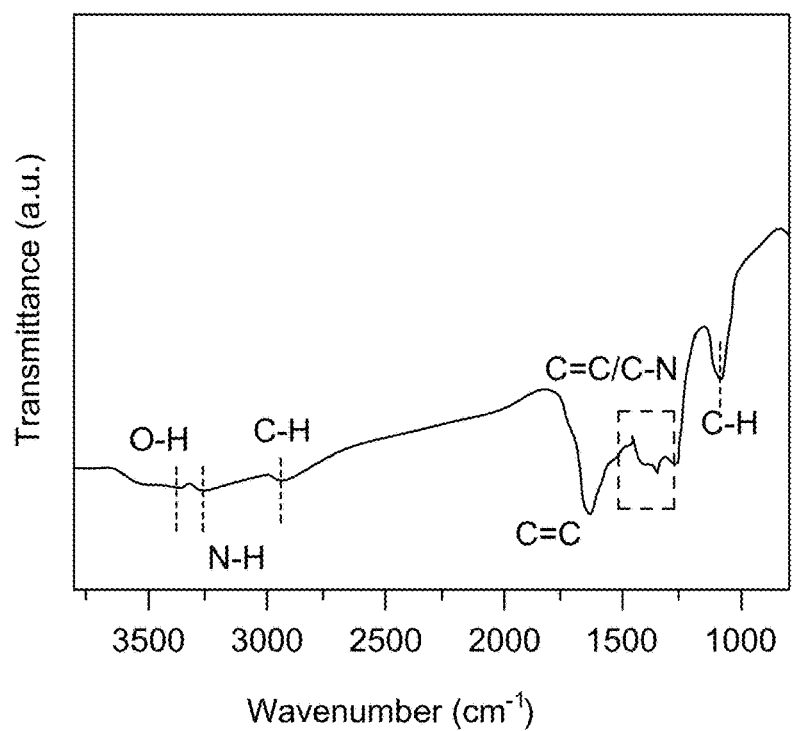
FIG. 7C illustrates a Fourier transform infrared spectroscopy (FTIR) spectra of N-doped GQDs, according to certain embodiments.

FIG. 7A illustrates the particle size distribution of the synthesized N-doped GQDs was recorded by High-resolution transmission electron microscopy (HRTEM) images. The HRTEM images reveal the quasi-spherical nanoparticles of a uniform size of 5 nm. FIG. 7B illustrates Raman spectra of N-doped GQDs exhibiting D and G bands at 1262 cm$^{-1}$ and 1582 cm$^{-1}$ of graphene. The D-band originates from the disorders in sp$^2$ hybridized carbon and G-band corresponds to the in-phase vibration of graphite lattice. The intensity of disordered band (D-band) is quite low compared to ordered G-band attributed highly crystalline nature of synthesized GQDs, which have better electrical properties. The peak at 1396 cm$^{-1}$ corresponds to N-doped GQDs, further confirming the Nitrogen doping in graphene quantum dots. FIG. 7C illustrates the successfully N-doping in GQD, the FTIR measurement was carried out. The Band in the range of 2934 cm$^{-1}$-2881 cm$^{-1}$ and at 1103 cm$^{-1}$ corresponds to C—H stretching vibrations, whereas the C=C vibration band appears at 1645 cm$^{-1}$ and 1440 cm$^{-1}$. N-loading in GQDs was confirmed by the band observed at 1345 cm$^{-1}$ corresponds to C—N stretching.

Evaluation of PV Cell Parameters

The photocurrent $J_{ph}$ was predicted by equation (7):

$$J_{ph} = J_{sc}\left(1 + \frac{R_s}{R_{sc}}\right) + J_0\left(e^{\frac{J_{sc}R_s}{nV_T}} - 1\right) \quad (7)$$

where thermal voltage $V_T = k_B T/q$, with $k_B$, Boltzmann constant, q is electronic charge, and T is temperature. $R_{oc}$ was determined from the inverse of slope $(m_{oc})^{-1}$ of the J-V curve at open circuit condition ($V = V_{oc}$ and $J=0$).

The shunt resistor represents the current loss due to recombination of charge carriers and leakage current and determines from the inverse of J-V slope $(m_{sc})^{-1}$ at short circuit condition ($V=0$, $J=J_{sc}$) using equation (8).

$$R_{sh} = R_{sc} \quad (8)$$

Series resistance can be predicted using equation (9)

$$R_s = R_{oc} - \frac{nV_T}{J_0}e^{-V_{oc}/nV_T} \quad (9)$$

The diode ideality factor was predicted by the equation (10).

$$n = \frac{V_m + J_m R_{oc} - V_{oc}}{V_T[\ln(J_{sc} - V_m/R_{sc} - J_m) - \ln(J_{sc} - V_{oc}/R_{sc}) + J_m/(J_{sc} - V_{oc}/R_{sc})]} \quad (10)$$

The reverse saturation current density was predicted through the equation (11)

$$J_0 = \left[J_{sc} - \frac{V_{oc}}{R_{sc}}\right] \exp\left[\frac{V_{oc}}{nV_T}\right] \quad (11)$$

Evaluation of Capacitance from Constant Phase Element (CPE)

The capacitance C1 corresponds to geometrical capacitance and bulk dielectric relaxation of the perovskites layer was determined from CPE1 through the equation (12):

$$C_1 = \left[\left(\frac{1}{R_S} + \frac{1}{R_1}\right)^{p_1-1} T_1\right]^{1/p_1} \quad (12)$$

The capacitance C2 corresponds to low-frequency mechanisms including ionic transport, interfacial charge accumulation, and transport, and was evaluated from CPE2 through the equation (13):

$$C_2 = \left[\left(\frac{1}{R_S + R_1} + \frac{1}{R_2}\right)^{p_2-1} T_2\right]^{1/p_2} \quad (13)$$

NGQD passivation to suppress the nonradiative recombination and improve the charge transport in planer p-i-n PSCs was successfully demonstrated. As a result, NGQD passivated device performance was improved to 17.10% compared to 15.03% of control device, attributed to increase of $J_{sc}$ to 21.64 mA/cm$^2$, reduction of n and $J_0$ values to 1.241 and 1.368×10$^{-16}$ A/cm$^2$, respectively compared to $J_{sc}$=20.42 mA/cm$^2$, n=1.611, and $J_0$=4.244×10$^{-13}$ A/cm$^2$ of the control device. NGQD passivation led to a decrease of trap density to 4.68×10$^{16}$ cm$^{-3}$ and an increase of charge carrier lifetime to 59.9 ns as compared to 5.53×10$^{16}$ cm$^{-3}$ and 31.7 ns, respectively, for the controlled device. Further, NGQD passivation results in a reduction of interfacial charge transfer resistance around one order (from 1.39×10$^6$ to 6.071×10$^5$Ω) and an increase of charge carrier mobility (from 5.10×10$^{-4}$ to 8.30×10$^{-4}$ cm$^2$/Vs), reveals the passivation improve the charge carrier dynamics between perovskites and electron transport layer. The experiment indicates that NGQD passivation has a significant potential to synergically passivated defects and improved charge transfer at perovskites/ETL in p-i-n PSCs. The performance of the PSCs can be further improved via bulk passivation using NGQDs.

Obviously, numerous modifications and variations of the present disclosure are possible in light of the above teachings. It is therefore to be understood that within the scope of the appended claims, the invention may be practiced otherwise than as specifically described herein.

The invention claimed is:

1. A method for producing a perovskite solar cell comprising, in order, (i) a first layer comprising a conducting material coated glass plate as a substrate; (ii) a second layer comprising copper doped nickel oxide; (iii) a third layer comprising a methylammonium lead iodide (MAPbI$_3$) perovskite; (iv) a fourth layer comprising N-doped graphene quantum dots; (v) a fifth layer comprising a fullerene derivative; and (vi) a top layer comprising a conductive layer, said method comprising:
   treating the conducting material coated glass plate in UV ozone to produce the substrate as the first layer;
   coating copper doped nickel oxide on the top of the substrate to produce the second layer;
   coating the MAPbI$_3$ perovskite on the second layer to produce the third layer;
   coating a solution of N-doped graphene quantum dots on the third layer to produce the fourth layer;
   coating the fullerene derivative on the fourth layer to produce the fifth layer; and
   coating the conductive layer on the fifth layer to produce the top layer,
   wherein the N-doped graphene quantum dots consist of N, C, O, and H.

2. The method of claim 1, wherein the perovskite solar cell has an interfacial charge transfer resistance of 1×10$^5$ to 9×10$^5$Ω.

3. The method of claim 1, wherein the perovskite solar cell has a charge carrier mobility of 7×10$^{-4}$ to 1×10$^{-3}$ cm$^2$/Vs.

4. The method of claim 1, wherein the perovskite solar cell has a conversion efficiency of 16 to 20%.

5. The method of claim 1, wherein the perovskite solar cell has an integrated current density that is 5 to 10% greater than a perovskite solar cell without N-doped graphene quantum dots.

6. The method of claim 1, wherein the perovskite solar cell has a conversion efficiency that is 10 to 20% greater than a perovskite solar cell without N-doped graphene quantum dots.

7. The method of claim 1, wherein the perovskite solar cell has a recombination lifetime of 50 to 80 ns.

8. The method of claim 1, wherein the perovskite solar cell has an interfacial charge transfer of 3 to 10×10$^5$Ω.

9. The method of claim 1, wherein the perovskite solar cell has an ideality factor (n) of 0.8 to 1.5.

10. The method of claim 1, wherein the perovskite solar cell has a leakage current ($J_0$) of 0.5 to 3×10$^{-16}$ A/cm$^2$.

11. The method of claim 1, wherein the perovskite solar cell has the fourth layer suppresses defect-assisted recombination.

12. The method of claim 1, wherein the perovskite solar cell has a conductivity of 2 to 6×10$^{-8}$ Scm$^{-1}$.

13. The method of claim 1, wherein the third layer and the fourth layer are separate layers,
   wherein the N-doped graphene quantum dots are present on the surface of the third layer,
   wherein the perovskite is in the form of crystalline flakes with a mean diameter of 0.1 to 1 µm, and
   wherein the third layer is a continuous layer of the crystalline flakes.

14. The method of claim 1, further comprising:
   cleaning the substrate with at least one soap solution, water, alcohol, and acetone before the treatment in UV ozone.

15. The method of claim 1, wherein the solution of N-doped graphene quantum dots is coated on the third layer by thermal annealing at 50-200° C. to produce the fourth layer.

16. The method of claim 1, further comprising:
   coating the metal-by electron beam deposition on the fifth layer to produce the top layer.

17. The method of claim 1, wherein the top layer has a thickness of 100-300 nm.

18. The method of claim 1, wherein the N-doped graphene quantum dots are spherical and have an average diameter of 5 nm.

* * * * *